US008803268B2

United States Patent
Heck et al.

(10) Patent No.: US 8,803,268 B2
(45) Date of Patent: Aug. 12, 2014

(54) VERTICAL MIRROR IN A SILICON PHOTONIC CIRCUIT

(71) Applicant: Intel Corporation, Santa Clara, CA (US)

(72) Inventors: John Heck, Berkeley, CA (US);
Ansheng Liu, Cupertino, CA (US);
Michael T. Morse, San Jose, CA (US);
Haisheng Rong, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/871,083

(22) Filed: Apr. 26, 2013

(65) Prior Publication Data

US 2013/0299932 A1    Nov. 14, 2013

Related U.S. Application Data

(62) Division of application No. 12/567,601, filed on Sep. 25, 2009, now Pat. No. 8,435,809.

(51) Int. Cl.
*H01L 27/14*      (2006.01)

(52) U.S. Cl.
USPC ............ 257/431; 257/290; 257/443; 257/459

(58) Field of Classification Search
USPC ................................. 257/431, 290, 443, 459
See application file for complete search history.

(56) References Cited

U.S. PATENT DOCUMENTS 5,260,588 A     11/1993  Ohta et al.
8,435,809 B2 *  5/2013   Heck et al. .................. 438/29

FOREIGN PATENT DOCUMENTS

| CN | 101191871 A | 6/2008 |
|---|---|---|
| JP | 08-046292 A | 2/1996 |
| JP | 11-191654 A | 7/1997 |
| JP | 1999-191654 | 7/1999 |
| WO | 04-343484 A | 11/1992 |
| WO | 2011037742 A2 | 3/2011 |
| WO | 2011037742 A3 | 6/2011 |

OTHER PUBLICATIONS

International Search Report and Written Opinion received for PCT Patent Application No. PCT/US2010/047987, mailed on May 2, 2011, 9 pages.
International Preliminary Report received for PCT Patent Application No. PCT/US2010/047987, mailed on Apr. 5, 2012, 7 pages.
Office action received for Chinese Patent Application No. 201010294280.3, mailed on Jul. 31, 2012, 5 pages of Chinese office action and 4 pages of English Translation.

(Continued)

*Primary Examiner* — Samuel Gebremariam
(74) *Attorney, Agent, or Firm* — Blakely, Sokoloff, Taylor & Zafman LLP

(57) ABSTRACT

A vertical total internal reflection (TIR) mirror and fabrication thereof is made by creating a re-entrant profile using crystallographic silicon etching. Starting with an SOI wafer, a deep silicon etch is used to expose the buried oxide layer, which is then wet-etched (in HF), opening the bottom surface of the Si device layer. This bottom silicon surface is then exposed so that in a crystallographic etch, the resulting shape is a re-entrant trapezoid with facets These facets can be used in conjunction with planar silicon waveguides to reflect the light upwards based on the TIR principle. Alternately, light can be coupled into the silicon waveguides from above the wafer for such purposes as wafer level testing.

7 Claims, 2 Drawing Sheets

(56) References Cited

OTHER PUBLICATIONS

Strandman et al. "Fabrication of 45° mirrors together with well-defined v-grooves using wet anisotropic etching of silicon", Journal of Microelectromechanical Systems, vol. 4, No. 4, Dec. 1995, pp. 213-219.

Office action received for Korean Patent Application No. 2012-7007505, mailed on May 24, 2013, 2 pages of English Translation only.

Office Action from Korean Application No. 2012-7007505 mailed May 24. 2013, 2 pages.

* cited by examiner

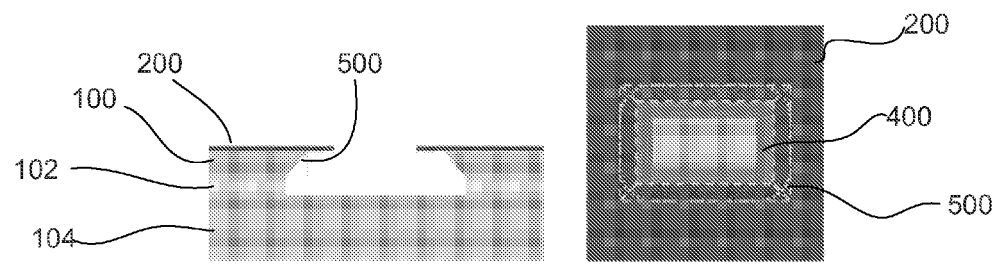
Fig. 5
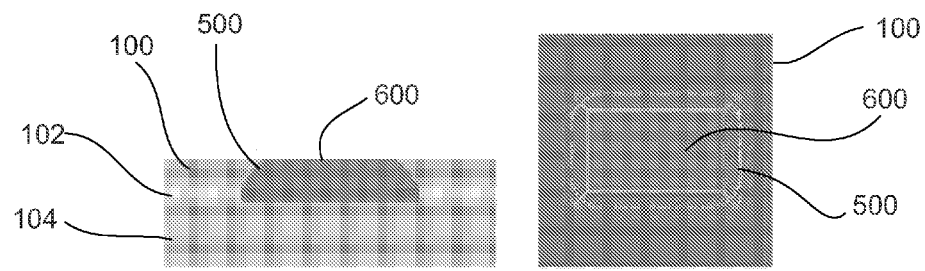
Fig. 6
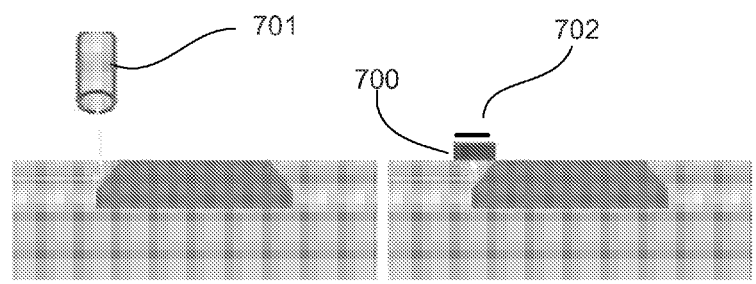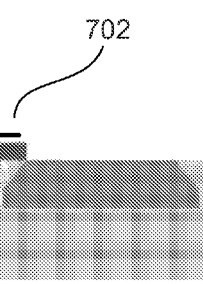
Fig. 7A          Fig. 7B

VERTICAL MIRROR IN A SILICON PHOTONIC CIRCUIT

CROSS REFERENCE TO RELATED APPLICATIONS

This application is a Divisional of, and claims priority to, U.S. patent application Ser. No. 12/567,601, filed on Sep. 25, 2009, the contents of which are herein incorporated by reference.

Embodiments of the present invention are directed to photonic circuits and, more particularly, to a vertical mirror in a photonic circuit for directing light normal to the surface of the circuit.

BACKGROUND INFORMATION

Silicon photonic circuits generally route optical signals in planar waveguides, and it is difficult to provide a path for light to enter/exit the circuits vertically. Routing light in or out of the wafer surface can be valuable for several reasons, such as coupling into a normal-incidence photodetector on the wafer surface, for wafer-level optical test/characterization, or other potential applications.

Of particular interest is the integration of planar silicon waveguides with Ge-based photodetectors. This is being addressed in several ways, all of which have various challenges. Planar photodetectors, in which the Ge is grown on top of the Si waveguide are quite large, because the optical coupling is inefficient and a long distance is needed for sufficient coupling of light to occur from the Si to the Ge.

To avoid this difficulty, trench sidewall photodetectors have been proposed, where the waveguide is terminated by a vertical facet. In this case, a facet with sufficient smoothness is difficult to form, and the epitaxial growth of the Ge-based photodetector can be very challenging.

Another area of interest is that of wafer-level optical testing. Currently, silicon photonic die must be singulated and have the edges polished in order to do optical testing; this is an expensive and time consuming process. The vertical mirror would enable rapid and inexpensive optical testing at the wafer level, dramatically reducing development times and testing costs.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

FIG. 5 comprises side-by-side side and top views of a wafer illustrating the fabrication steps for creating a TIR mirror device showing the trapezoidal region including a facet in the Si layer on the (111) plane;

FIG. 6 comprises side-by-side side and top views of a wafer illustrating the fabrication steps for creating a TIR mirror device after replanerization; and FIGS. 7A and 7B illustrate the TIR mirror device used in a wafer-level test system and having a photodetector fabricated thereon, respectively.

DETAILED DESCRIPTION

Described is an apparatus and method comprising a total internal reflection (TIR) mirror that reflects light from planar silicon waveguides into the direction normal to the wafer surface (and vice-versa), enabling many such applications.

Embodiments described herein comprise a vertical TIR mirror and fabrication method thereof. The mirror may be made by creating a re-entrant profile using crystallographic silicon etching. Starting with an silicon on insulator (SOI) wafer, a deep silicon etch is used to expose the buried oxide layer, which is then wet-etched, opening the bottom surface of the Si device layer. This bottom silicon surface is then exposed so that in a crystallographic etch, the resulting shape is a re-entrant trapezoid with facets approximately 54° to the normal direction. These facets may be used in conjunction with planar silicon waveguides to reflect the light upwards based on the TIR principle. Alternately, light can be coupled into the silicon waveguides from above the wafer.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
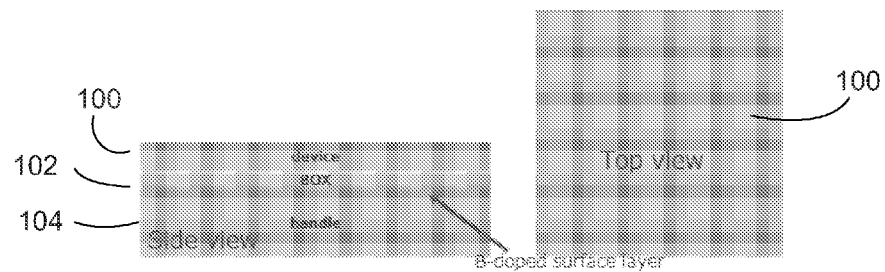
FIG. 1 comprises side-by-side side and top views of a wafer illustrating the fabrication steps for creating a total internal reflection (TIR) mirror device.

Referring now to FIG. 1, there is shown a top view and a side view of one embodiment of the inventive device in the first stages of fabrication. A device fabrication wafer (100) 100, comprising a silicon on insulator (SOI) wafer, sits atop a buried oxide layer (BOX) 102 on a handle wafer 104. The handle wafer 104 may be heavily boron-doped (~$10^{20}$ cm$^{-3}$) by implantation to prevent later etching.

Figure 2:
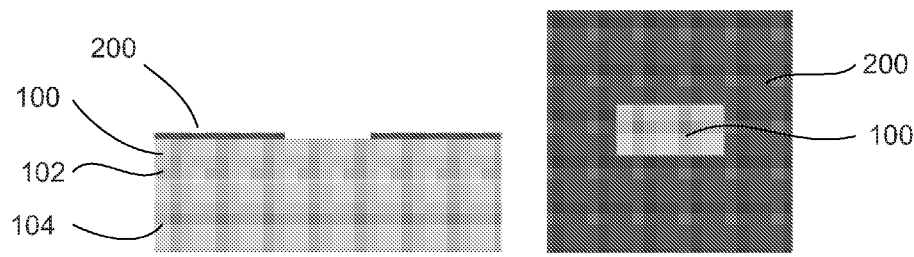
FIG. 2 comprises side-by-side side and top views of a wafer illustrating the fabrication steps for creating a TIR mirror device coated with a nitride layer.
Figure 3:
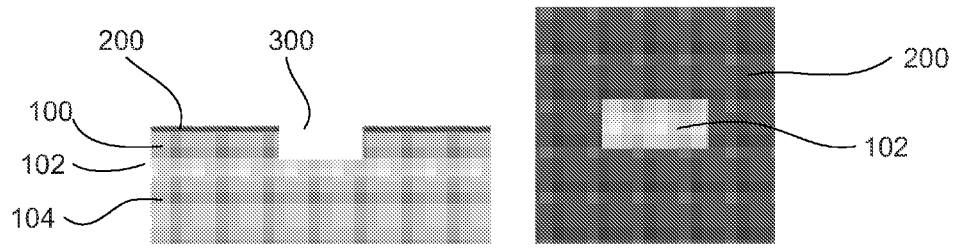
FIG. 3 comprises side-by-side side and top views of a wafer illustrating the fabrication steps for creating a TIR mirror device having an etched trench.
Figure 4:
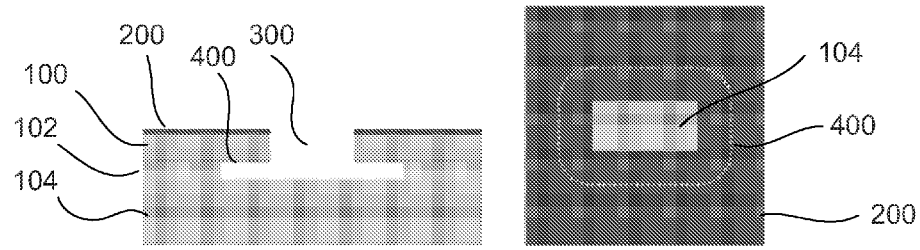
FIG. 4 comprises side-by-side side and top views of a wafer illustrating the fabrication steps for creating a TIR mirror device having an undercut area.

FIG. 2 shows the device wafer 100 having a nitride layer 200 patterned on its surface. As shown in FIG. 3, the Si wafer 100 may be etched down to the buried oxide (BOX) 102 to create a trench 300 using, for example a deep reactive ion etch (DRIE). In FIG. 4, the oxide layer 102 may be etched, such as by, for example, a wet etch in hydrofluidic acid (HF) to create an undercut area 400 beneath the Si device layer 100.

Referring now to FIG. 5, the wafer 100 may be immersed in a crystallographic etchant such as potassium hydroxide (KOH). In some embodiments, ammonium hydroxide (NH$_4$OH), ethylene diamene pyrocatechol (EDP) or tetramethyl ammonium hydroxide (TMAH) may be used. The bottom of the device layer 100 is exposed to the etchant, creating an inverted trapezoidal shape with a 54.7° angle to the normal. This angle may also be tuned by changing the etch conditions, such as composition or temperature, potentially creating a 45° facet. The etch terminates at the top silicon nitride layer 200. Assuming the handle wafer 104 is boron-doped as described earlier, it will not etch during this step; otherwise there will be a similar trapezoidal recess going downward into the handle wafer 100.

As shown in FIG. 6, the nitride layer 200 may be optionally removed to eliminate any overhang as shown in FIG. 5. The wafer 100 may be re-planarized by depositing and reflowing a thick oxide layer 600, for example. Alternately a polymeric material may be used for replanarization. Embodiments avoid the above challenges discussed above by creating an ultra-smooth mirror 500 defined by a re-entrant (111) crystal plane of the Si wafer 100, which reflects the light upward; thus optical signals can be coupled efficiently to the wafer surface.

At this point, the re-entrant TIR mirror 500 has been made, and the silicon photonic devices can be tested at the wafer level as illustrated in FIG. 7A. These mirrors 500 can be used in conjunction with planar silicon waveguides to reflect the light upwards based on the TIR principle. Alternately, light can be coupled into the silicon waveguides from above the wafer. Wafer-level optical test systems 701 can be utilized for batch testing without the need for cleaving and polishing before optical tests can be performed.

Alternately, as shown in FIG. 7B, a photodetector 700 may be formed on the surface of the wafer 100, positioned above the mirror 500. Such compact Ge photodetectors can be fabricated using standard surface processing, and furthermore a mirror 702, such as made from an aluminum or gold layer, may easily be fabricated on top of the photodetector, enabling a doubling in the detection efficiency as light passes through the Ge layer twice.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A vertical mirror on a silicon photonic circuit, comprising:
   a silicon device wafer;
   a buried oxide (BOX) layer under the silicon device wafer;
   a handle wafer doped with a p-type dopant under the BOX layer; and
   a trapezoid shaped area having a bottom side defined by the handle wafer, opposite vertical sides defined by the BOX layer, and inwardly angled facets above the vertical sides defined by the silicon device wafer, wherein the facets act as vertical total internal reflection (TIR) mirrors.

2. The vertical mirror as recited in claim 1, further comprising:
   an oxide layer filling the trapezoid shaped area.

3. The vertical mirror as recited in claim 2, wherein the surface of the silicon device wafer has a (100) crystal plane orientation.

4. The vertical mirror as recited in claim 1 wherein the facet lies in a (111) crystal plane orientation in the silicon device wafer.

5. The vertical mirror as recited in claim 1 wherein the P-type dopant comprises boron having a concentration of approximately 1020 cm-3.

6. The vertical mirror as recited in claim 1 wherein the facet comprises an angle 54 degrees to 45 degrees to the normal.

7. The vertical mirror as recited in claim 6 further comprising a Ge photodetector over the facet having a mirror formed on top of the photodetector to cause light to pass through the Ge photodetector twice.

\* \* \* \* \*

UNITED STATES PATENT AND TRADEMARK OFFICE
CERTIFICATE OF CORRECTION

PATENT NO.        : 8,803,268 B2
APPLICATION NO.   : 13/871083
DATED             : August 12, 2014
INVENTOR(S)       : Heck et al.

Page 1 of 1

It is certified that error appears in the above-identified patent and that said Letters Patent is hereby corrected as shown below:

Insert in column 1, line 4 before CROSS REFERENCE TO RELATED APPLICATIONS:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*